United States Patent [19]

Mori

[11] Patent Number: 4,788,662
[45] Date of Patent: Nov. 29, 1988

[54] SEMICONDUCTOR MEMORY DEVICE USING RESONANT-TUNNELING HOT ELECTRON TRANSISTOR

[75] Inventor: Toshihiko Mori, Isehara, Japan

[73] Assignee: Director-General, Agency of Industrial Science and Technology, Tokyo, Japan

[21] Appl. No.: 61,288

[22] Filed: Jun. 12, 1987

[30] Foreign Application Priority Data

Jun. 14, 1986 [JP] Japan ............................ 61-138630

[51] Int. Cl.$^4$ .................... G11C 11/40; G11C 13/00
[52] U.S. Cl. .................................. 365/159; 357/4; 357/57; 365/179
[58] Field of Search ............... 357/4, 7, 57; 365/159, 365/174, 179

[56] References Cited

U.S. PATENT DOCUMENTS

4,712,121 12/1987 Yokoyama ........................ 357/4
4,721,983 1/1988 Frazier ............................. 357/4

*Primary Examiner*—Terrell W. Fears
*Attorney, Agent, or Firm*—Oblon, Fisher, Spivak, McClelland & Maier

[57] ABSTRACT

A semiconductor memory device comprises an address line, a write line, a read line, and a memory cell connected to the address, write and read lines, where the memory cell comprises a power source, an RHET, a switching element and a data transfer element. The power source is coupled to a base of the RHET through a first resistor so that the RHET has a plurality of stable states. The switching element is coupled between the write line and the base of the RHET, and is controlled by a signal from the address line. The data transfer element is coupled between a collector of the RHET and the read line, and the collector is coupled to the power source through a second resistor. When reading an information from the memory cell, a signal corresponding to one of the plurality of stable states of the RHET is transmitted to the read line via the data transfer element.

11 Claims, 9 Drawing Sheets

FIG.1A

FIG.1B
Energy Level →

SEMICONDUCTOR MEMORY DEVICE USING RESONANT-TUNNELING HOT ELECTRON TRANSISTOR

BACKGROUND OF THE INVENTION

The present invention generally relates to semiconductor memory devices, and more particularly to a semiconductor memory device comprising as a memory active element a resonant-tunneling hot electron transistor (hereinafter simply referred to as an RHET) which uses the resonant-tunneling effect.

Various kinds of semiconductor memory devices have been proposed, but there are still demands for semiconductor memory devices with even higher speed and higher integration density. However, due to the technical limit to the integration and the increase in the media delay time caused by the increased wire capacitance, it is reaching a stage of deadlock where the demands have been satisfied to a point near the limit according to the present technology of producing the semiconductor memory devices. In order to break this deadlock, the active element itself must operate at a higher speed and also have new functions, so that the number of active elements can be reduced and the higher speed can be achieved while maintaining the functions of the semiconductor memory device.

Presently, in order to produce a practical static memory cell, at least four transistors are normally required when field effect transistors are used. It is possible to produce a practical static memory cell by use of two transistors when bipolar transistors are used, but in this case, the bipolar transistors must have four terminals, that is, have a double emitter configuration.

In a new generation of further improved semiconductor memory devices, it is desirable that the semiconductor memory device not only operate at a high speed but also use a reduced number of active elements. But no such semiconductor memory device has yet been proposed, mainly because there is no existing memory active element suitable for use in such a new generation of semiconductor memory device for carrying out the desired functions.

Recently, the RHET which uses the resonant-tunneling effect has been proposed. The RHET is disclosed in a paper "A Resonant-tunneling Hot Electron Transistor (RHET)" by Naoki Yokoyama et al., the Proceedings of the Twelfth International Symposium on Gallium Arsenide and Related Compounds held in Karuizawa, Japan, Sept. 23–26, 1985 (Institute of Physics Conference Series No. 79, Chapter 13, Adam Hilger Ltd., Bristol and Boston), and also in an article "A New Functional, Resonant-tunneling Hot Electron Transistor (RHET)" by Naoki Yokoyama et al., Japanese Journal of Applied Physics, Volume 24, No. 11, November, 1985, pp.L853–L854. A flip-flop circuit using this RHET was previously proposed in a U.S. patent application Ser. No. 918,300 filed Oct. 10, 1986 in which the present inventor is one of the inventors. The present invention effectively uses this RHET to realize a semiconductor memory device having the desired functions described before.

SUMMARY OF THE INVENTION

It is a general object to provide a novel and useful semiconductor memory device using RHET in which the demands described heretofore are satisfied.

Another and more specific object of the present invention is to provide a semiconductor memory device comprising an address line, a write line, a read line, and a memory cell connected to the address, write and read lines, where the memory cell comprises a power source, an RHET, a switching element and a data transfer element. The power source is coupled to a base of the RHET through a first resistor so that the RHET has a plurality of stable states. The switching element is coupled between the write line and the base of the RHET, and is controlled by a signal from the address line. The data transfer element is coupled between a collector of the RHET and the read line, and the collector is coupled to the power source through a second resistor. When reading an information from the memory cell, a signal corresponding to one of the plurality of stable states of the RHET is transmitted to the read line via the data transfer element. According to the semiconductor memory device of the present invention, the integration density and the operation speed of the memory device can further be improved because the memory cell can be realized by use of only two three-terminal active elements and stably function as a stable memory cell.

Other objects and further features of the present invention will be apparent from the following detailed description when read in conjunction with the accompanying drawings.

DETAILED DESCRIPTION

Figure 1A:
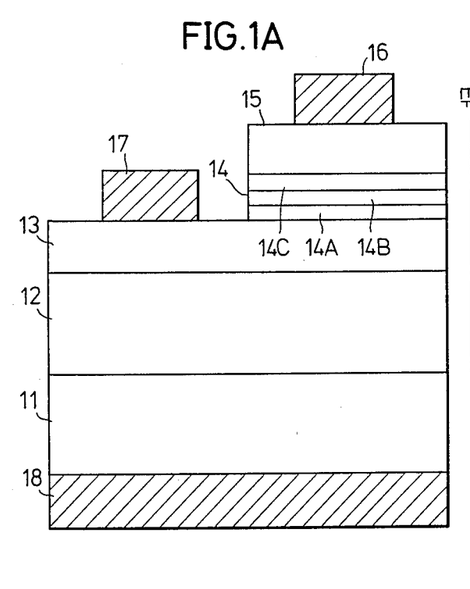
FIGS. 1A and 1B respectively are a cross sectional view and an energy band diagram of an RHET.

First, a description will be given on an RHET (resonant-tunneling hot electron transistor) which is used in the semiconductor memory device according to the present invention, by referring to FIGS. 1A and 1B. FIG. 1A shows a cross sectional view of an essential part of the RHET, and FIG. 1B is a corresponding energy band diagram.

In FIG. 1A, an $Al_yGa_{1-y}As$ collector potential barrier layer 12 is formed on one side of an n+-type GaAs collector layer 11, and an n+-type GaAs base layer 13 is formed on the collector potential barrier layer 12. A superlattice layer 14 is formed on the base layer 13, and an n+-type GaAs emitter layer 15 is formed on the superlattice layer 14. An emitter electrode 16 is formed on the emitter layer 15, a base electrode 17 is formed on the base layer 13, and a collector electrode 18 is formed on the other side of the collector layer 11. The superlattice layer 14 comprises a GaAs quantum well layer 14B which is sandwiched between a pair of $Al_xGa_{1-x}As$ barrier layers 14A and 14C. However, it is not essential that the superlattice layer 14 is constituted by two barrier layers and one quantum well lyyer, and a plurality of quantum well layers and a number of barrier layers required to form these quantum well layers may be provided according to the needs.

Figure 1B:
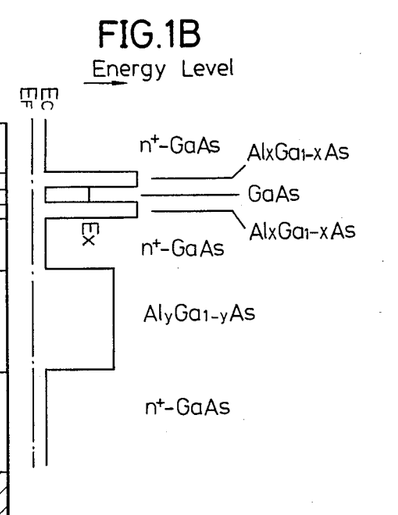

FIG. 1B shows the energy levels of the layers of the RHET shown in FIG. 1A, where the abscissa indicates the energy level and $E_C$, $E_F$ and $E_X$ respectively denote the bottom of the conduction band, the Fermi energy level and the energy level of the sub band formed within the quantum well layer 14B.

FIGS. 2A through 2D are energy band diagrams for explaining the operating principle of the RHET. In FIGS. 2A through 2D, those parts which are the same as those corresponding parts in FIG. 1A are designated by the same reference numerals and characters, and a description thereof will be omitted. Furthermore, in FIGS. 2A through 2D, the ordinate indicates the energy level, q denotes the charge of the carrier (electron), $\phi_C$ denotes the conduction band discontinuity between the collector potential barrier layer 12 and the base layer 13, and $V_{BE}$ denotes the base-emitter voltage of the RHET.

Figures 2A, 2B, 2C:
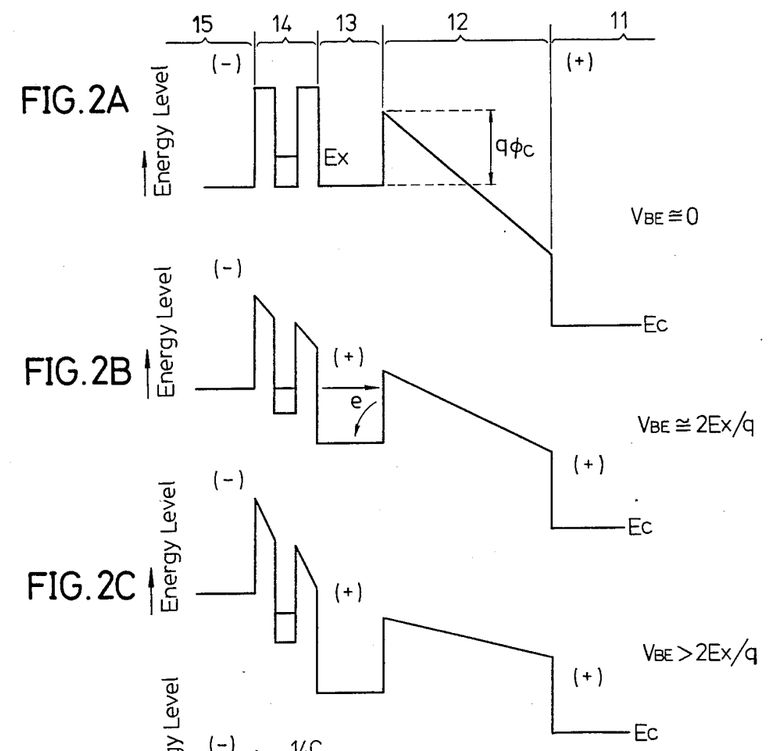
FIGS. 2A through 2D are energy band diagrams for explaining the operating principle of the RHET.

FIG. 2A shows the energy band diagram for the case where the base-emitter voltage $V_{BE}$ is zero or close to zero. In FIG. 2A, a voltage $V_{CE}$ is applied between the collector and the emitter of the RHET, but the energy level of the quantum well layer 14B differs from the energy level $E_X$ of the sub band because the base-emitter voltage $V_{BE}$ is virtually zero. As a result, it is impossible for the electrons in the emitter layer 15 to reach the base layer 13 by tunneling through the superlattice layer 14, and there is no current flow in the RHET.

FIG. 2B shows the energy band diagram for the case where the base-emitter voltage $V_{BE}$ is approximately equal to $2E_X/q$. In FIG. 2B, the energy level of the emitter layer 15 coincides with the energy level $E_X$ of the sub band within the quantum well layer 14. For this reason, the electrons in the emitter layer 15 are injected to the base layer 13 by resonant-tunneling through the superlattice layer 14. The potential energy ($\simeq 2E_X$) is converted into kinetic energy in the base layer 13 and the electrons assume the so-called hot state (hot electrons), and the electrons injected into the base layer 13 are ballistically transferred to the collector layer 11 through the base layer 13. But when the energy level of the collector potential barrier layer 12 is higher than $2E_X$, virtually all of the electrons are blocked by the collector potential barrier layer 12, and as a result, there is a base current flow and no collector current flow.

FIG. 2C shows the energy band diagram for the case where the base-emitter voltage $V_{BE}$ is greater than $2E_X/q$. In this case, no resonant-tunneling effect occurs because the energy level of the emitter layer 15 is greater than the energy level $E_X$ of the sub band within the quantum well layer 14B. Thus, there is no injection of electrons from the emitter layer 15 to the base layer 13, and the current flow decreases.

Figure 2D:
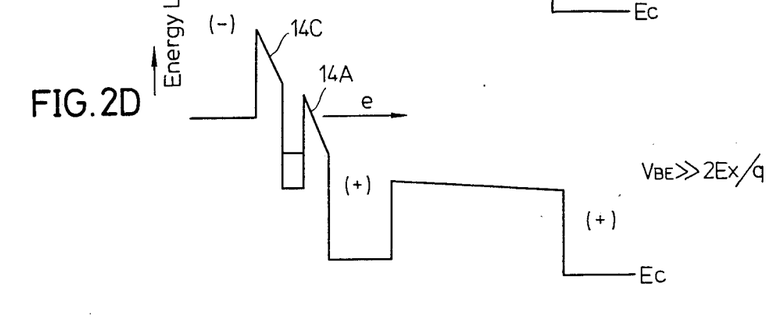

FIG. 2D shows the energy band diagram for the case where the base-emitter voltage $V_{BE}$ is considerably large compared to $2E_X/q$. In this case, between the two barrier layers 14A and 14C, the barrier layer 14A which is closer to the base layer 13 has an energy level lower than the energy level of the emitter layer 15. Hence, the electrons tunnel directly through the the barrier layer 14C which is closer to the emitter layer 15. In addition, since the electrons tunneling directly through the barrier layer 14C have an energy level sufficiently large compared to the energy level of the collector potential barrier layer 12, the electrons reach the collector layer 11.

Figure 3:
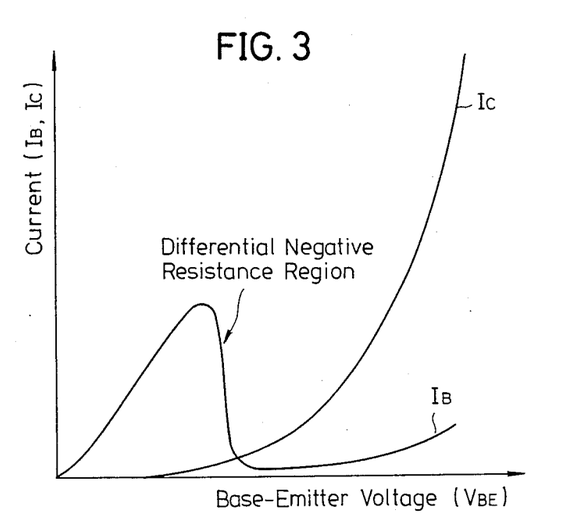
FIG. 3 is a graph showing the base current versus base-emitter voltage characteristic and the collector current versus base-emitter voltage characteristic of the RHET.

FIG. 3 shows the relationships of the base current $I_B$ and the collector current $I_C$ with respect to the base-emitter voltage $V_{BE}$ of the RHET described heretofore. In FIG. 3, the ordinate indicates the base current $I_B$ and the collector current $I_C$, while the abscissa indicates the base-emitter voltage $V_{BE}$. As may be seen from the base-emitter voltage versus base current characteristic of the RHET shown in FIG. 3, the negative differential resistance region exists due to the resonant-tunneling effect. Accordingly, it is possible to use the RHET as the memory active element by effectively utilizing this negative differential resistance region in the characteristic of the RHET.

Figure 4:
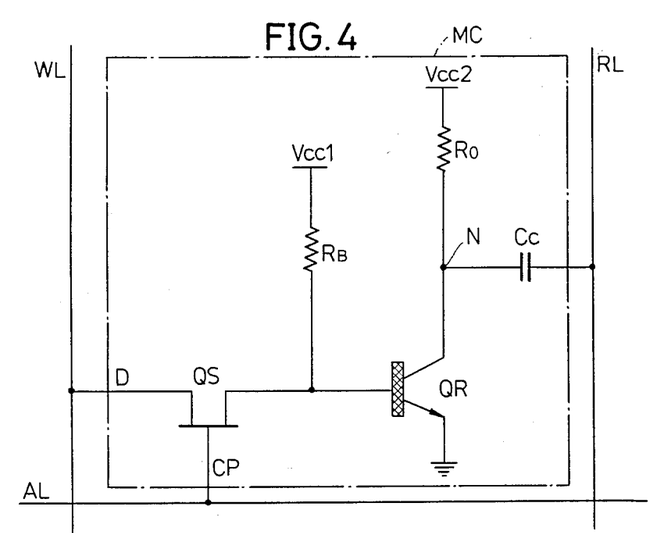
FIG. 4 is a circuit diagram showing a memory cell of a first embodiment of the semiconductor memory device according to the present invention for explaining the operating principle thereof.

FIG. 4 is a circuit diagram showing a memory cell of a first embodiment of the semiconductor memory device according to the present invention for explaining the operating principle thereof. FIG. 4 shows a unit memory circuit (memory cell) MC comprising an RHET $Q_R$ which is used as the memory active element, a switching element $Q_S$, a load resistor $R_O$, a current source resistor $R_B$, and a coupling capacitor $C_C$. An address line AL is connected to the switching element $Q_S$, a write line WL is connected to the switching element $Q_S$, and a read line RL is connected to the coupling capacitor $C_C$. Hence, a node N between the collector of the RHET $Q_R$ and the load resistor $R_O$ is coupled to the read line RL via the coupling capacitor $C_C$. In FIG. 4, Vcc1 and Vcc2 denote positive power source voltages.

Figure 5:
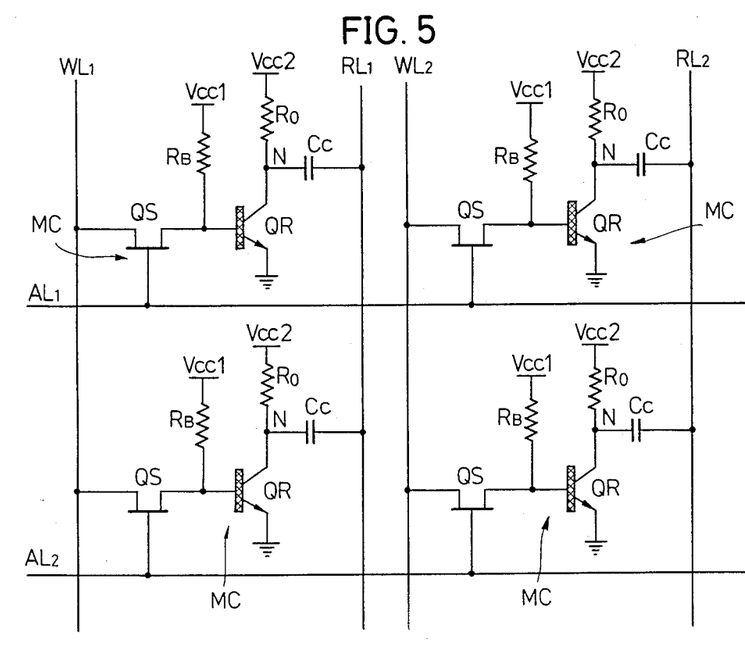
FIG. 5 is a circuit diagram showing an essential part of the first embodiment of the semiconductor memory device using the memory cell shown in FIG. 4.

FIG. 5 is a circuit diagram showing an essential part of the first embodiment of the semiconductor memory device according to the present invention, that is, a portion of a memory cell array made up of the memory cells MC of the type shown in FIG. 4. In FIG. 5, those parts which are the same as those corresponding parts in FIG. 4 are designated by the same reference characters, and a description thereof will be omitted. In FIG. 5, each memory cell MC is connected to one of address lines AL1, AL2, . . . , one of write lines WL1, WL2, . . . , and one of read lines RL1, RL2, . . . .

Figure 6A:
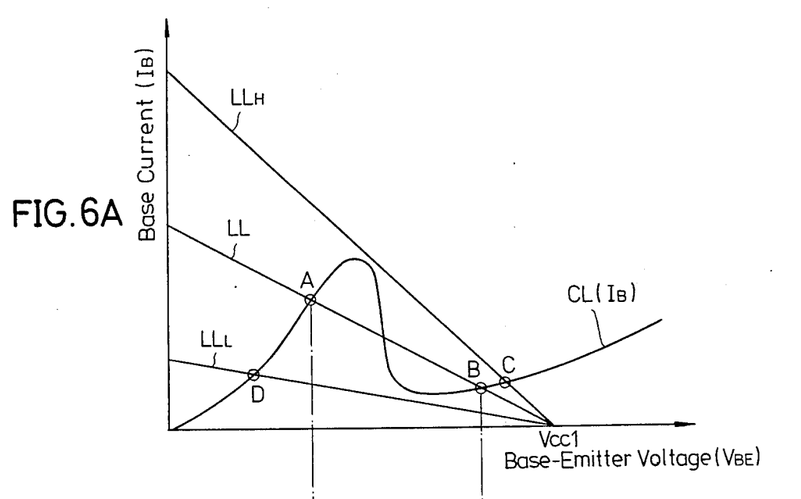
FIG. 6A show the base-emitter voltage versus base current characteristic of the RHET for explaining the states thereof.

In FIGS. 4 and 5, when the power source voltage Vcc1 is applied to the base of the RHET $Q_R$ via the resistor $R_B$, this part of the memory cell MC becomes equivalent to a circuit having a constant current source inserted between the base and emitter of the RHET $Q_R$. As a result, the base-emitter voltage versus base current characteristic CL of the RHET $Q_R$ becomes as shown in FIG. 6A. In FIG. 6A, the abscissa indicates the base-emitter voltage $V_{BE}$ of the RHET $Q_R$ and the ordinate indicates the base current $I_B$. In addition, LL denotes a load line for the case where the switching element $Q_S$ is OFF, $LL_H$ denotes a load line for the case where the switching element $Q_S$ is ON and the level at the write line WL shown in FIG. 4 is high, $LL_L$ denotes a load line for the case where the switching element $Q_S$ is ON and the level at the write line WL is low, and A, B, C and D indicate stable points.

When the switching element $Q_S$ is OFF, it may be seen from the load line LL that the RHET $Q_R$ can have two stable states as shown by the stable points A and B in FIG. 6A.

When the switching element $Q_S$ undergoes transitions from the OFF state (load line LL) to the ON state and then again to the OFF state and the level at the word line WL is high (load line $LL_H$), there are transitions of the stable point from the point A or B to the point B via the point C. On the other hand, when the level at the word line WL is low ($LL_L$), there are transitions of the stable point from the point A or B to the point A via the point D.

Hence, the state of the RHET $Q_R$ can be changed from one of the two stable states to the other by the switching element $Q_S$, as may be seen from the two stable points A and B shown in FIG. 6A.

Figure 6B:
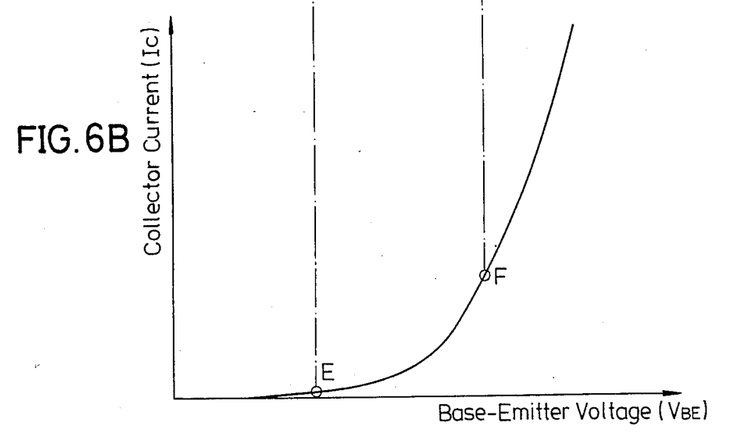
FIG. 6B shows the base-emitter voltage versus collector current characteristic of the RHET in correspondence with FIG. 6A for explaining the states of the RHET.

FIG. 6B is a graph showing the base-emitter voltage versus collector current characteristic in correspondence with the characteristic CL shown in FIG. 6A. In FIG. 6B, the abscissa indicates the base-emitter voltage $V_{BE}$ of the RHET $Q_R$ on the same scale as that used in FIG. 6A, and the ordinate indicates the collector current $I_C$. In addition, points E and F shown in FIG. 6B respectively correspond to the stable points A and B shown in FIG. 6A. A large collector current $I_C$ flows at the point F shown in FIG. 6B which corresponds to the stable point B shown in FIG. 6A, and for this reason, the collector potential of the RHET $Q_R$ becomes low at the point F due to the load resistor $R_O$. On the other hand, only a small collector current $I_C$ flows at the point E shown in FIG. 6B which corresponds to the stable point A shown in FIG. 6A, and hence, the collector potential of the RHET $Q_R$ becomes high at the point E.

Accordingly, when writing an information into a specific memory cell MC, the levels at the address line AL and the read line RL which are connected to the specific memory cell MC are set to high levels, and it is possible to write a high-level information (information "1") or a low-level information (information "0") into the specific memory cell MC by setting the level at the write line WL which is connected to the specific memory cell MC to either the high or low level.

On the other hand, when reading the stored information from the specific memory cell MC, the switching element $Q_S$ is turned ON, the level of the write line WL connected to the specific memory cell MC is changed within such a range that the state of the RHET $Q_R$ does not change, and the change in the collector potential of the RHET $Q_R$ is read out via the read line RL.

Figure 7:
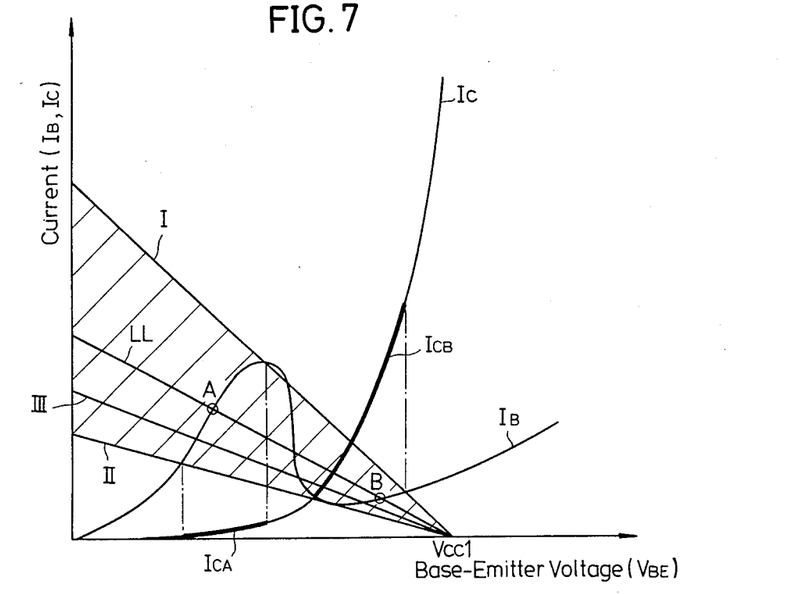
FIG. 7 is a graph showing the base current versus base-emitter voltage characteristic and the collector current versus base-emitter voltage characteristic of the RHET for explaining the read operation of the semiconductor memory device according to the present invention.

FIG. 7 shows the relationships of the base current $I_B$ and the collector current $I_C$ with respect to the base-emitter voltage $V_{BE}$ when the read operation is carried out. In FIG. 7, those parts which are the same as those corresponding parts in FIG. 6A are designated by the same reference characters. In addtion, the hatched region between load lines I and II indicate the region in which the state of the RHET $Q_R$ does not change. When the load line changes LL within the region between the load lines I and II as indicated by a load line III, for example, that is, when the level of the write line WL connected to the specific memory cell MC is varied, the change in the collector current $I_C$ is extremely small in the vicinity of the stable point A as indicated by the bold solid line $I_{CA}$ while the change in the collector current $I_C$ is large in the vicinity of the stable point B as indicated by the bold solid line $I_{CB}$. The change in the collector current $I_C$ results in the change in the potential at the node N.

Therefore, by appropriately varying the level at the write line WL which is connected to the specific memory cell MC, it is possible to read the stored information from the specific memory cell MC via the coupling capacitor $C_C$ and the read line RL, without disturbing the two stable states of the RHET $Q_R$.

According to the present embodiment, it is possible to obtain two stable states at the base of the RHET $Q_R$ by the resonant-tunneling effect, and the state of the RHET $Q_R$ can be changed arbitrarily from one state to the other. Presently, in order to produce a practical static memory cell, at least four transistors are normally required when field effect transistors are used. It is possible to produce a practical static memory cell by use of two transistors when bipolar transistors are used, but in this case, the bipolar transistors must have four terminals, that is, have a double emitter configuration. On the other hand, according to the present invention, the memory cell can be constituted by use of only two transistors, namely the RHET $Q_R$ and the switching element $Q_S$ which is a field effect transistor (FET), for example. Furthermore, the memory cell not only has a simple construction, but the operation thereof is stable and the operation speed is high.

Next, a description will be given on the data obtained from the node N by use of a probe (not shown) when the write and read operations are carried out for the memory cell MC shown in FIG. 1 with the circuit constants selected as follows.

$R_B = 1.5$ kΩ
$R_O = 10$ kΩ
Vcc1 = 1V
Vcc2 = 1V

Figure 8A:
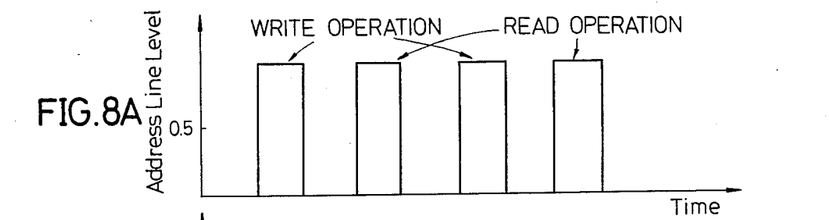
FIGS. 8A through 8C are diagrams respectively showing the change in the level at the address line, the write line and the read line with time for the memory cell shown in FIG. 4.
Figure 8B:
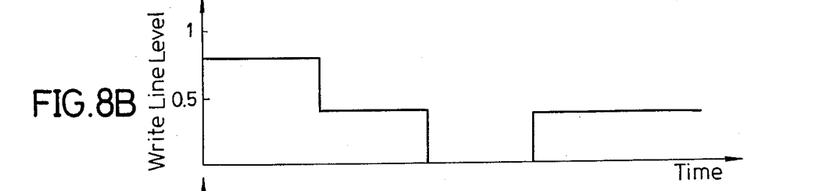
Figure 8C:
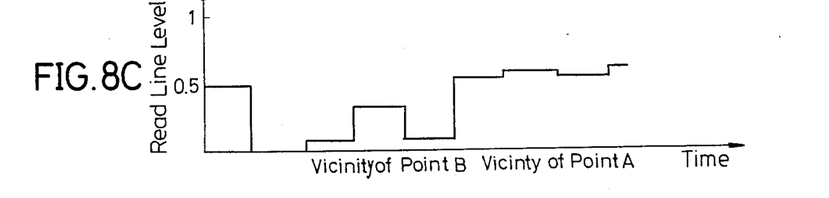

FIG. 8A shows the change in the level at the address line AL with time, FIG. 8B shows the change in the level at the write line WL with time and FIG. 8C shows the change in the level at the read line RL with time. As may be seen from FIGS. 8A through 8C, the memory cell MC using the RHET $Q_R$ properly functions and operates as a memory cell.

In the described embodiment, the level at the word line WL is varied when reading the stored information from the memory cell. But it is also possible to carry out the read operation by fixing the level at the write line WL to a predetermined level within such a range that the state of the RHET $Q_R$ does not change so that a load line other than the load line LL is obtained within the range defined by the load lines I and II in FIG. 7, and alternately change the level at the address line AL to high and low levels so that the switching element $Q_S$ is repeatedly turned ON and OFF alternately. As may be seen from FIG. 7, a load line III, for example, is obtained when the switching element $Q_S$ is ON and the load line LL is obtained when the switching element $Q_S$ is OFF. Accordingly, it is possible to read the stored information from the memory cell based on the difference between the change in the collector current $I_C$ in the vicinity of the stable point A and the change in the collector current $I_C$ in the vicinity of the stable point B.

Figure 9:
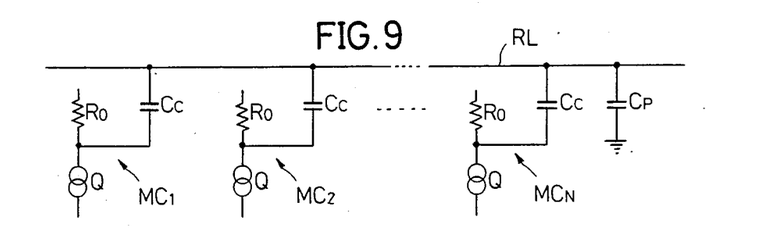
FIGS. 9 through 12 respectively are equivalent circuit diagrams for explaining the read operation in the first embodiment of the semiconductor memory device.

Next, a description will be given on the method of reading the stored information from the memory cell in the first embodiment of the semiconductor memory device. FIG. 9 shows an equivalent circuit of the memory device during the read operation when N memory cells $MC_1$ through $MC_N$ are connected to the read line RL. In FIG. 9, those parts which are the same as those of corresponding parts in FIG. 4 are designated by the same reference characters. Further, the switching element $Q_S$ is replaced by an equivalent current source Q, and $C_P$ denotes the parasitic capacitance of the read line RL.

Figure 10:
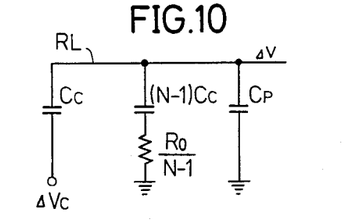
Figure 11:
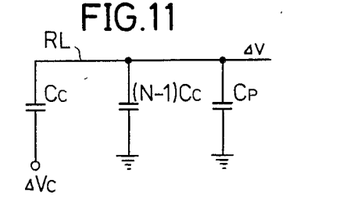
Figure 12:
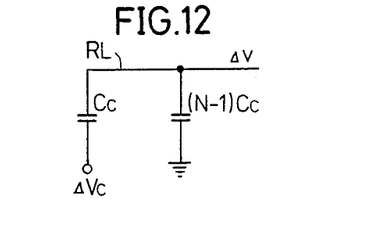

It will be assumed that the stored information is read from the memory cell $MC_1$, there is a potential change $\Delta V_C$ in the current source Q of the memory cell $MC_1$ and a potential change $\Delta V$ results on the read line RL. In this case, since there is no potential change in the memory cells $MC_2$ through $MC_N$ which are other than the memory cell $MC_1$, the resistances of the current sources Q of the memory cells $MC_2$ through $MC_N$ may be regarded as being infinitely large. Hence, the circuit shown in FIG. 9 may be illustrated by an equivalent circuit shown in FIG. 10. In addition, when the value of N is sufficiently large, the resistance $R_O/N-1$ is negligible, and the circuit shown in FIG. 10 may be illustrated by an equivalent circuit shown in FIG. 11. Moreover, when $N \cdot C_C > C_P$, the parasitic capacitance $C_P$ is negligible, and the circuit shown in FIG. 11 may be illustrated by an equivalent circuit shown in FIG. 12. In FIG. 12, the potential change $\Delta V$ on the read line RL can be described by $\Delta V = \Delta V_C / N$.

Figure 13:
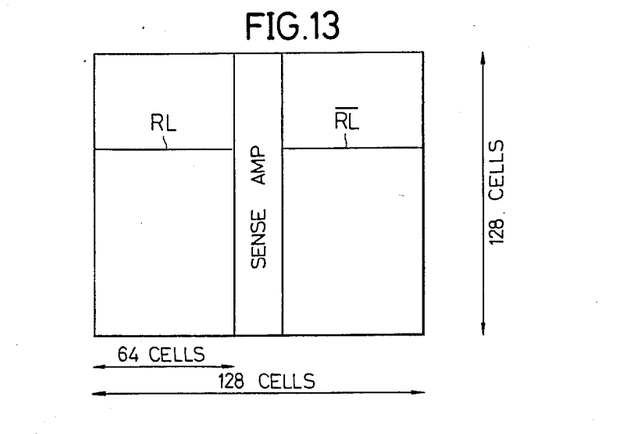
FIG. 13 shows a layout of the memory cell array which may be used in the first embodiment of the semiconductor memory device.

For convenience' sake, a 16 kbit memory cell array having such a layout that a sense amplifier SA is located at the center of the memory cell array as shown in FIG. 13 will be considered. In FIG. 13, 64 memory cells are connected to one read line RL on the left side of the sense amplifier SA. The potential change $\Delta V_C$ when reading the stored information from the memory cell when the memory cell is ON is in the order of 0.3V, for example. Accordingly, the potential change $\Delta V$ on the read line RL is in the order of 5 mV and is small. On the other hand, there is no potential change $\Delta V$ on the read line RL when the memory cell is OFF. For example, when reading the stored information from one memory cell connected to the read line RL on the left side of the sense amplifier SA, there is no potential change on a corresponding read line $\overline{RL}$ on the right side of the sense amplifier SA.

The potential on the read line RL itself is subject to thermal deviation, and the use of a differential amplifier may be considered suitable for sensing and amplifying the small potential change. In this case, the differential amplifier is used to amplify the difference in the potential change on the read line RL and the potential change on the corresponding read line $\overline{RL}$. However, when reading the stored information from a certain memory cell which is OFF, the potential change on the read line RL which is connected to this certain memory cell is zero. On the other hand, the potential change on the corresponding read line $\overline{RL}$ on the other side is also zero. As a result, the operation of the differential amplifier becomes unstable in this case, and it would be impossible to accurately read the stored information.

Figure 14:
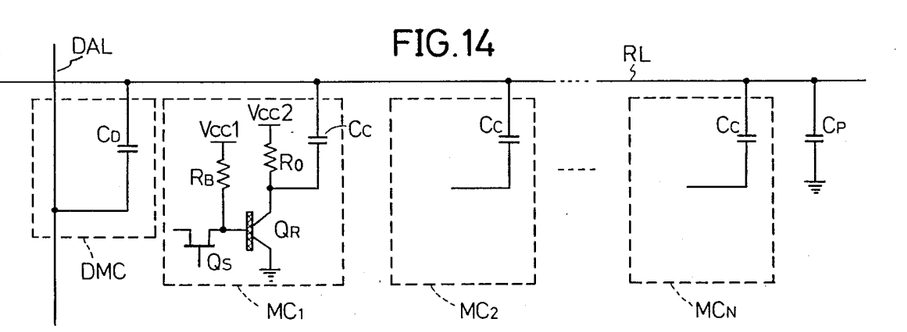
FIG. 14 is a circuit diagram showing an embodiment of an essential part of the memory cell array used in the first embodiment of the semiconductor memory device.

Next, a description will be given on an embodiment of an essential part of a memory cell array of the first embodiment of the semiconductor memory device by referring to FIG. 14. In the present embodiment, a dummy memory cell DMC is coupled to the read line RL via a coupling capacitor $C_D$ thereof. This dummy memory cell DMC is connected to a dummy address line DAL. Measures are taken so that the potential change on the read line RL caused by the dummy memory cell DMC is an approximate center value between the potential change of 5 mV when the memory cell ($MC_1$, for example) is ON and the potential change of 0V when the memory cell is OFF. Concretely speaking, the capacitance of the coupling capacitor $C_D$ may be set to ½ the capacitance of the coupling capacitor $C_C$ and set the potential change on the dummy address line DAL to $\Delta V_C$, or the capacitance of the coupling capacito $C_D$ may be set equal to the capacitance of the coupling capacitor $C_C$ and set the potential change on the dummy address line DAL to $\Delta V_C/2$.

Accordingly, when reading the stored information from a specific memory cell connected to the read line RL on the left side of the sense amplifier SA in FIG. 13, a dummy memory cell connected to the corresponding read line $\overline{RL}$ on the right side of the sense amplifier SA is turned ON. When the specific memory cell is ON, the potential change on the read line RL is $\Delta V$, and the potential change on the read line RL is zero when the specific memory cell is OFF. On the other hand, the potential change on the corresponding read line $\overline{RL}$ is constantly $\Delta V/2$. As a result, there is always a difference between the potential change on the read line RL and the potential change on the corresponding read line $\overline{RL}$, and it is possible to positively and accurately read the stored information from the specific memory cell.

Figure 15:
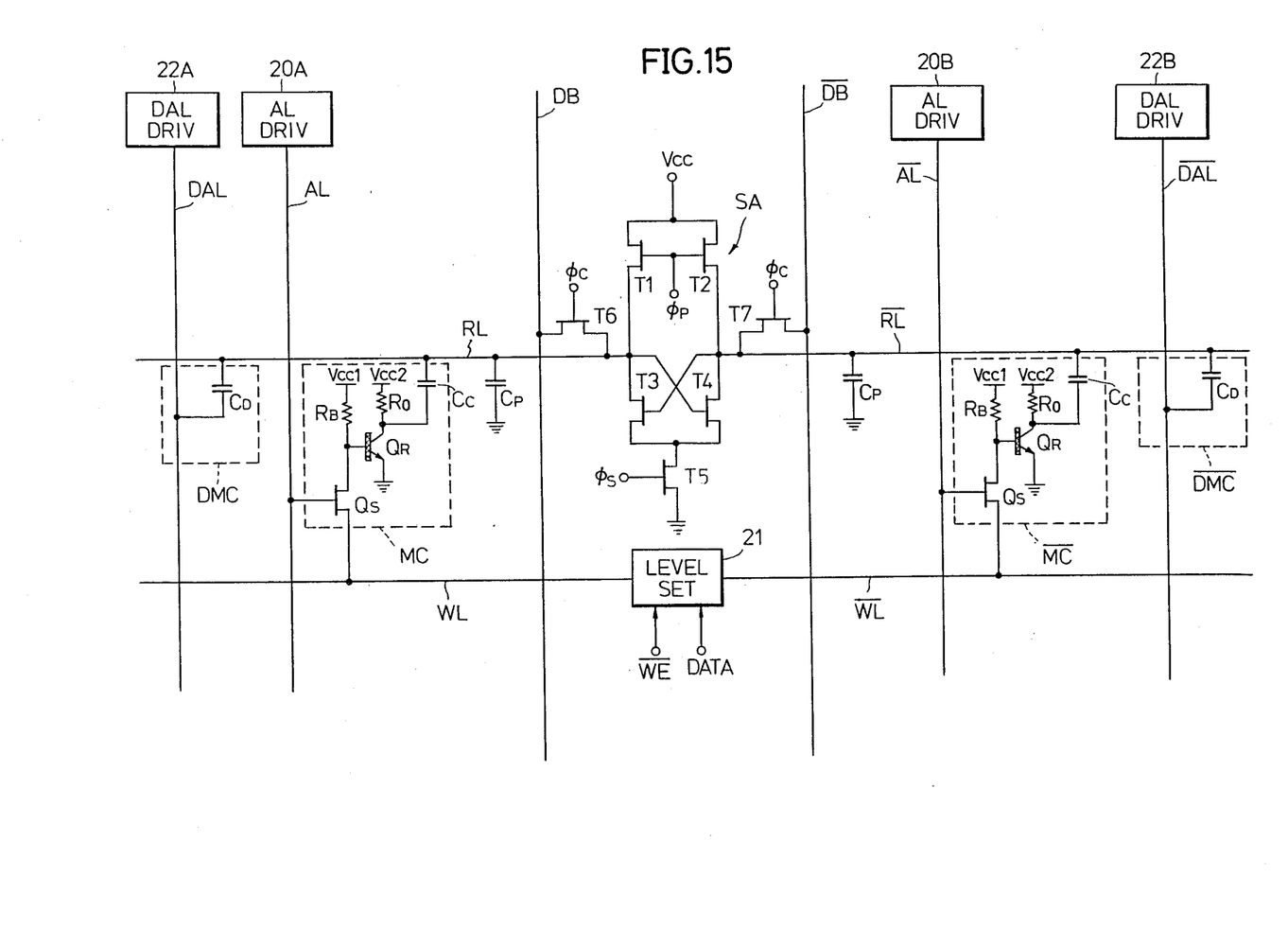
FIG. 15 is a circuit diagram showing an embodiment of an essential part of the first embodiment of the semiconductor memory device.

FIG. 15 shows an embodiment of an essential part of the first embodiment of the semiconductor memory device described before. In FIG. 15, those parts which are the same as those corresponding parts in FIGS. 4 and 14 are designated by the same reference characters. In FIG. 15, the sense amplifier SA comprises transistors T1 through T5 which are connected as shown to constitute a flip-flop, and transistors T6 and T7. The transistors T6 and T7 are connected to data buses DB and $\overline{DB}$, respectively. The operation of the sense amplifier SA will not be described in detail in the present specification because the operation is similar to a sense amplifier which is generally used in a known dynamic random access memory (DRAM) device. It will be assumed for convenience' sake that the capacitance of the coupling capacitor $C_D$ is ½ the capacitance of the coupling capacitor $C_C$, the potential change on the dummy address line DAL is $\Delta V_C$, and the memory cell MC is ON.

When writing an information into the memory cell MC, an address line driver 20A drives the address line AL which is connected to the memory cell MC to a high level, and the level at the read line RL is set to a high level. A write enable signal $\overline{WE}$ which enables the write operation and a write-in datum are supplied to a level setting circuit 21. When the write-in datum is "1", the level setting circuit 21 set the write line WL to a high level, and the level setting circuit 21 sets the write line WL to a low level when the write-in datum is "0". As shown in FIG. 15, the level setting circuit 21 also drives a write line $\overline{WL}$, and an address line driver 20B drives an address line $\overline{AL}$ which is connected to a memory cell $\overline{MC}$.

Figure 16:
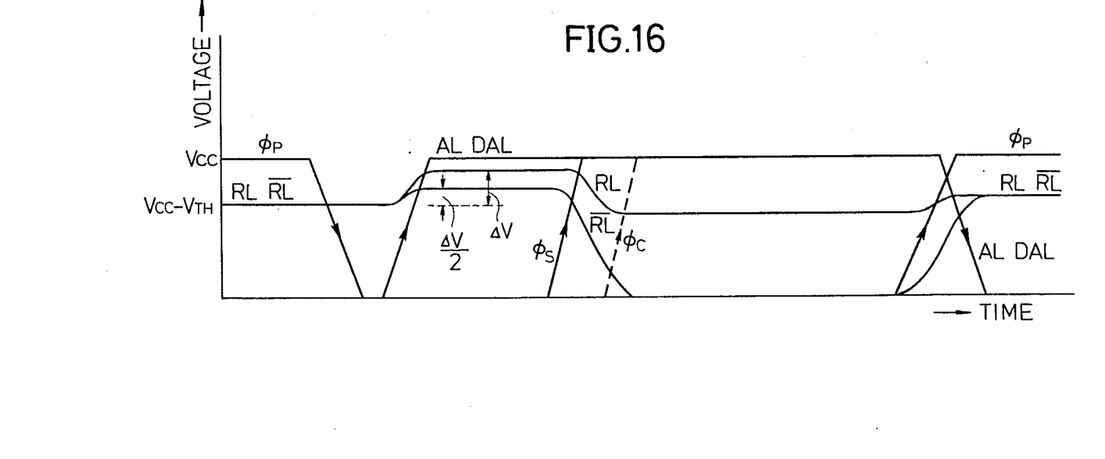
FIG. 16 is a timing chart for explaining the operation of the circuit shown in FIG. 15.

On the other hand, when reading the stored information from the memory cell MC, it is assumed for convenience sake that the write line WL is fixed to a predetermined level within such a range that the state of the RHET $Q_R$ in the memory cell MC does not change so that a load line other than the load line LL is obtained as described before, and the circuit shown in FIG. 15 is operated in accordance with the time chart shown in FIG. 16. First, a voltage $\phi_P$ is set to a power source voltage Vcc so that the transistors T1 and T2 are turned ON. As a result, the levels on the read lines RL and $\overline{RL}$ are fixed to a voltage Vcc-$V_{TH}$, where $V_{TH}$ denotes the threshold voltage of the transistors T1 and T2. In addition, voltage $\phi_S$ is set to a low voltage so that the transistor T5 is turned OFF. In this state, the level setting circuit 21 sets the level of the write line WL to a predetermined level within such a range that the state of the RHET $Q_R$ in the memory cell MC does not change, responsive to a write disable signal $\overline{WE}$. Then, the voltage $\phi_P$ is set to a low voltage so that the transistors T1 and T2 are turned OFF, and as a result, the read lines RL and $\overline{RL}$ assume floating states. In this state, the address line driver 20A drives the address line AL to a high level (Vcc) and a uummy address line driver 22A drives the dummy address line DAL to a high level (Vcc). Corresponding operations are carried out on the other side of the sense amplifier SA by the address line driver 20B and a dummy address line driver 22B.

Accordingly, the level on the read line $\overline{RL}$ rises by $\Delta V$ while the level of the read line RL rises by $\Delta V/2$ as shown in FIG. 16. Then, when a voltage $\phi_S$ is raised to a high level (Vcc) so as to turn the transistor T5 ON, the transistor T3 is turned OFF while the transistor T4 is turned ON. When a voltage $\phi_C$ is raised to a high level (Vcc) as indicated by a phantom line in FIG. 16 so as to turn the transistors T6 and T7 ON, a high-level signal is obtained from the data bus DB while a low-level signal is obtained from the data bus $\overline{DB}$. Thereafter, the drivers 20A and 22A respectively set the levels of the address lines AL and DAL to low levels, and at the same time, the voltage $\phi_P$ is raised to the high level (Vcc) so as to turn the transistors T1 and T2 ON, and the read operation is completed. In a case where the level difference between the data buses DB and $\overline{DB}$ is small, it is possible to use a differential amplifier (not shown) so as to amplify the level difference.

Figure 17:
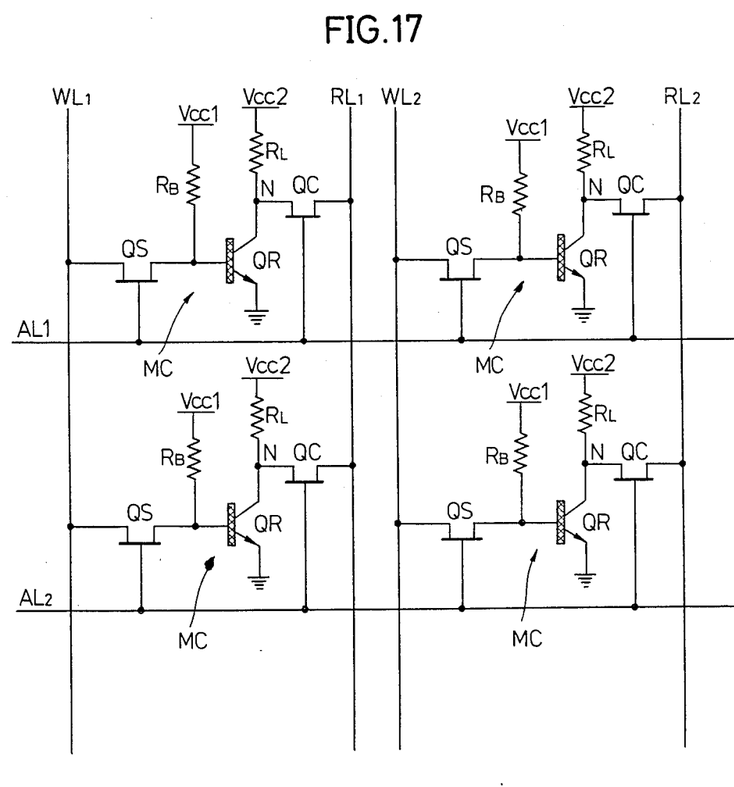
FIG. 17 is a circuit diagram showing an essential part of a second embodiment of the semiconductor memory device according to the present invention.

Next, a description will be given on a second embodiment of the semiconductor memory device according to the present invention by referring to FIG. 17 which shows an essential part of the second embodiment. In FIG. 17, those parts which are the same as those corresponding parts in FIG. 5 are designated by the same reference characters, and a description thereof will be omitted. In the present embodiment, resistors $R_L$ are used in place of the resistors $R_o$ and output transfer gates $Q_C$ are used in place of the coupling capacitors $C_C$. Hence, there is no need to change the potential at the write line WL1, for example, and the high or low collector potential of the RHET $Q_R$ is read onto the corresponding read line RL1 via the output transfer gate $Q_C$. Hence, when a specific memory cell MC is selected, only the corresponding address line AL1 out of the address lines AL1, AL2, . . . to which the specific memory cell MC is connected is selectively set to a high level. This high level signal from the selected address line AL1 is applied to the output transfer gate $Q_C$ so as to open the gate thereof, and the stored information in the specific memory cell MC is read onto the read line RL1 which is connected to the specific memory cell MC. For example, the output transfer gate $Q_C$ is constituted by a FET.

Further, the present invention is not limited to these embodiments, but various variations and modifications may be made without departing from the scope of the present invention.

What is claimed is:

1. A semiconductor memory device comprising:
an address line;
a write line;
a read line; and
a memory cell connected to said address line, said write line and said read line,
said memory cell comprising a memory active element, a power source coupled to a base of said memory active element through a first resistor, a switching element coupled between said write line and the base of said memory active element and controlled by a signal from said address line, and a data transfer element coupled between said read line and a collector of said memory active element, said collector being coupled to the power source through a second resistor,
said memory active element having a plurality of stable states and comprising an emitter potential barrier layer constituted by an emitter layer, a base layer and a superlattice layer formed between said emitter layer and said base layer, and a collector potential barrier layer formed between said base layer and a collector layer,
a base-emitter voltage versus current characteristic of said memory active element having at least one differential negative resistance region,
said data transfer element during a read operation of said semiconductor memory device transferring to said read line a signal corresponding to one of said plurality of stable states of said memory active element.

2. A semiconductor memory device as claimed in claim 1 in which said data transfer element comprises a capacitor.

3. A semiconductor memory device as claimed in claim 2 in which a write operation of said semiconductor memory device is carried out by setting levels of said address line and said read line to a first level and setting a level of said write line to one of first and second levels dependent on an information which is to be written into said memory cell, said first and second levels respectively corresponding to first and second logic levels.

4. A semiconductor memory device as claimed in claim 2 in which the read operation of said semiconductor memory device is carried out by setting a level of said address line to a high level, and varying a level of said write line within such a range that ON/OFF state of said memory active element does not change.

5. A semiconductor memory device as claimed in claim 2 in which the read operation of said semiconductor memory device is carried out by setting a level of said write line to a high level within such a range that ON/OFF state of said memory active element does not change, and alternately changing a level of said address line to high and low levels.

6. A semiconductor memory device as claimed in claim 1 in which said data transfer element comprises another switching element controlled by the signal from said address line.

7. A semiconductor memory device comprising:
a plurality of address lines;
a plurality of write lines;
a plurality of read lines; and
a memory cell array constituted by a plurality of identical memory cells, each of said memory cells being connected to one of said address lines, one of said write lines and one of said read lines,
each of said memory cells comprising a memory active element, a power source coupled to a base of said memory active element through a first resistor, a switching element coupled between a corresponding one of said write lines and the base of said memory active element and controlled by a signal from a corresponding one of said address lines, and a data transfer element coupled between a corresponding one of said read lines and a collector of said memory active element, said collector being coupled to the power source through a second resistor,
said memory active element having a plurality of stable states and comprising an emitter potential barrier layer constituted by an emitter layer, a base layer and a superlattice layer formed between said emitter layer and said base layer, and a collector potential barrier layer formed between said base layer and a collector layer,
a base-emitter voltage versus current characteristic of said memory active element having at least one differential negative resistance region,
said data transfer element of a predetermined memory cell during a read operation of said semiconductor memory device transferring to a corresponding one of said read lines a signal corresponding to one of said plurality of stable states of said memory active element of said predetermined memory cell.

8. A semiconductor memory device as claimed in claim 7 in which said data transfer element comprises a capacitor.

9. A semiconductor memory device as claimed in claim 8 which further comprises a plurality of dummy address lines, and a plurality of dummy memory cells each connected between a corresponding one of said read lines and a corresponding one of said dummy address lines.

10. A semiconductor memory device as claimed in claim 9 in which said dummy memory cell comprises a capacitor.

11. A semiconductor memory device as claimed in claim 7 in which said data transfer element comprises a switching element controlled by a signal from a corresponding one of said address lines.

* * * * *